United States Patent [19]

Chang et al.

[11] 4,259,647
[45] Mar. 31, 1981

[54] MILLIMETER WAVE IMAGE GUIDE INTEGRATED OSCILLATOR

[75] Inventors: Yu-Wen Chang, Rancho Palas Verdes; Yiu C. Ngan, Los Angeles, both of Calif.

[73] Assignee: The United States of America as represented by the Secretary of the Army, Washington, D.C.

[21] Appl. No.: 67,975

[22] Filed: Aug. 20, 1979

[51] Int. Cl.³ .................... H03B 7/14; H03B 9/14
[52] U.S. Cl. .................. 331/96; 331/107 DP; 331/107 SL; 333/230; 333/238; 333/249
[58] Field of Search ............ 331/96, 99, 107 DP, 331/107 SL, 107 G; 333/219, 222, 227, 230, 250, 238, 247

[56] References Cited

U.S. PATENT DOCUMENTS

| | | | |
|---|---|---|---|
| 3,903,488 | 9/1975 | Fong | 333/238 |
| 3,986,153 | 10/1976 | Kuno et al. | 331/107 SL X |
| 3,995,238 | 11/1976 | Knox et al. | 333/21 R |
| 4,006,425 | 2/1977 | Chang et al. | 329/160 |
| 4,016,506 | 4/1977 | Kofol | 331/107 SL X |
| 4,053,897 | 10/1977 | Nerheim | 331/107 DP X |

*Primary Examiner*—Siegfried H. Grimm
*Attorney, Agent, or Firm*—Nathan Edelberg; Jeremiah G. Murray; Bernard Franz

[57] ABSTRACT

A millimeter wave integrated oscillator circuit utilizing an active device such as an IMPATT or Gunn diode device located in a metallized dielectric cavity which is an extension of a half-height rectangular cross-sectional boron nitride image guide having a metallized under surface solder bonded to a metallic substrate forming an image plane. The diode is energized by means of a bias conductor fed into the cavity through a small slot in the cavity wall. One end of the image guide terminates in the cavity, while the opposite end is tapered along its sides and terminates in a full height hollow metal waveguide section partially including the metallic substrate. The metal waveguide section, moreover, includes flanges for coupling external circuit means to the image guide to metal waveguide transition.

12 Claims, 9 Drawing Figures

MILLIMETER WAVE IMAGE GUIDE INTEGRATED OSCILLATOR

The invention described herein may be manufactured and used by or for the Government for governmental purposes without the payment of any royalties thereon or therefor.

CROSS REFERENCE TO RELATED APPLICATION

This application is related to U.S. Ser. No. 067,974 entitled "Millimeter Wave Image Guide Integrated Balanced Mixer", filed on Aug. 20, 1979, now U.S. Pat. No. 4,232,401, in the names of Y. W. Chang, et al., which application is also assigned to the assignee of the present invention.

BACKGROUND OF THE INVENTION

The present invention relates generally to millimeter wave oscillators and more particularly to such an oscillator circuit integrated with an image waveguide structure.

Image waveguide transmission lines for operation in the range of frequencies of 30 GHz to 300 GHz are well known and consist of an elongated piece of dielectric material having appropriate cross sectional dimensions mounted on the surface of a metal plane. Electromagnetic waves at the operating frequencies of the millimeter wave region are adapted to propagate in the dielectric guide with low loss. The electromagnetic wave modal structure in the dielectric is reflected as the mirror image in the surface of the metal plane and thus the metal plane is referred to as the image plane. The use of image waveguide transmission lines as components of integrated circuits including both passive and active circuit elements, are also known, typical examples being the apparatus shown and described in: U.S. Pat. No. 3,986,153, H. J. Kuno, et al.; U.S. Pat. No. 3,995,238, R. M. Knox, et al.; and U.S. Pat. No. 4,006,425, Y. W. Chang, et al.

While such apparatus has proven to be satisfactory for certain millimeter wave applications, prior art practice is inherently deficient in providing a structure which exhibits greater efficiency, reliability and performance coupled together with an enhanced fabrication simplicity as well as minimum size, cost and weight.

SUMMARY

Accordingly, it is an object of the present invention to provide a new and improved millimeter image waveguide integrated circuit.

Another object is to provide an integrated circuit of the type described which is relatively economical in its fabrication as well as being durable and reliable in its operation.

Yet another object of the present invention is to provide a millimeter wave integrated circuit of the oscillator type.

The present invention is directed to an improved integrated oscillator circuit for generating and propagating generated signals in the 30–300 GHz range. Briefly, the subject invention comprises a metal substrate including a conductive image plane having a substantially flat surface on which a wafer of boron nitride (BN) having its under surface metallized, is metal bonded to the image plane. A half-height rectangular cross-sectional image guide and a metallized air filled cavity are formed from the boron nitride wafer on the upper surface of the image plane. Metallization is formed on the outer surfaces of the cavity and includes an opening and decoupling slots through which one end of the image waveguide projects inwardly towards a semiconductor millimeter wave diode positioned inside of the cavity. Means are formed through one wall of the cavity for energizing the diode into an oscillatory mode. Additionally, the cavity is closed at the top by means of a cover consisting of a piece of metallized boron nitride or a metal plate. At the opposite end of the boron nitride image waveguide is located a metal block having a linear channel formed therein which is secured to the top of the image plane to provide a full height metal waveguide section. The other end of the boron nitride image waveguide projects into the waveguide section and includes a taper implementing thereby an image waveguide to metal waveguide transition.

These and other objects of the subject invention will become more fully apparent when the following description is considered in light of the accompanying drawings.

DESCRIPTION OF THE PREFERRED EMBODIMENTS

Figure 1:
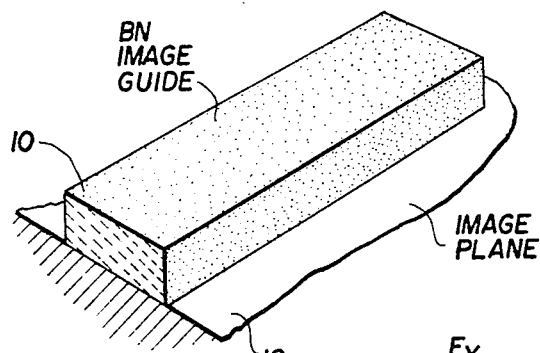
FIG. 1 is a perspective view broadly illustrative of an image waveguide structure.
Figure 2:
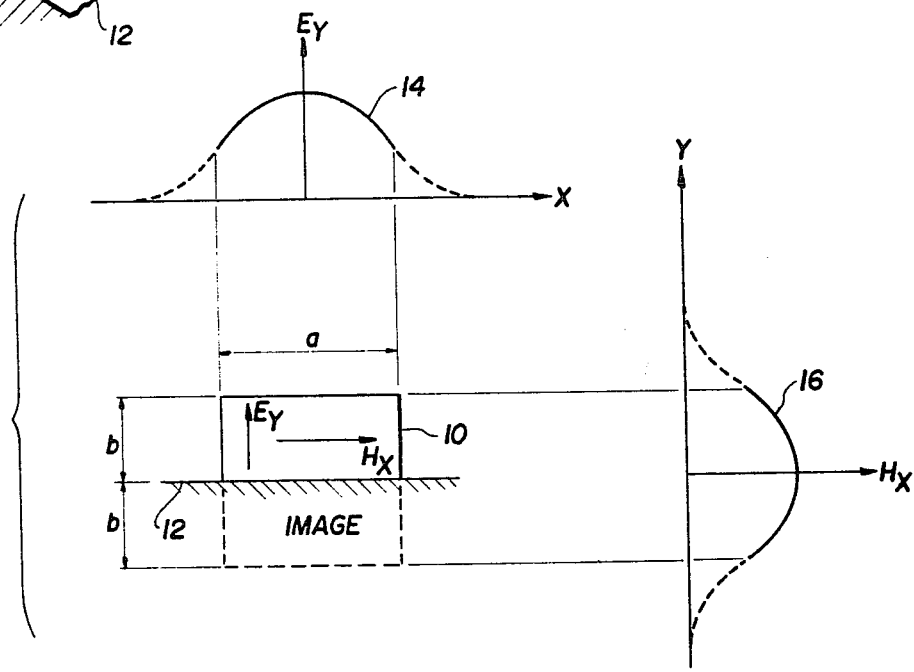
FIG. 2 is a diagram illustrative of a typical field configuration for the dominant $E^{Y}_{11}$ mode propagated through the image waveguide such as shown in FIG. 1.

Referring now to the drawings and more particularly to FIG. 1, reference numeral 10 designates a length of half-height dielectric material of generally rectangular cross section placed on the surface of a conductive image plane 12. In the instant invention, the dielectric material is comprised of boron nitride (BN) which is preferably hot pressed and which exhibits a dielectric constant in the range of 4.1 and 3.97 depending on the direction of pressing. In FIG. 2, the cross sectional width a and half-height b typically have the dimensions of a=0.110 inches, while b=0.074 inches. The image plane 12 comprises a gold plated substrate which, for example, consists of aluminum. In such devices the mode exhibiting the lowest loss is the $E^{y}_{11}$ mode. The distribution of the E and H fields in both the X and Y directions, which directions are mutually transverse to the direction along which millimeter or submillimeter wave energy propagation occurs is shown in FIG. 2. The curves 14 and 16 indicate that the E and H fields are at maximum at the mid point of their respective dimensions while falling off exponentially at a rate dependent upon the wave length and dielectric constant of the waveguide material. The dashed line extension of the curves 14 and 16 indicate that evanescent E and H fields exist beyond the physical boundaries of the waveguide structure. Such a characteristic is well known to those skilled in this type of technology.

Figure 3A:
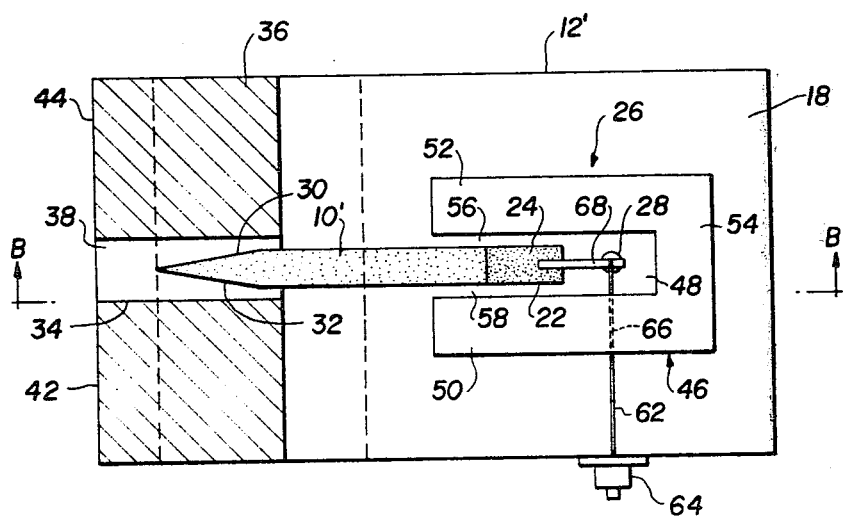
FIGS. 3A and 3B are sectional plan and side elevational views, respectively, of a first embodiment of the subject invention.
Figure 3B:
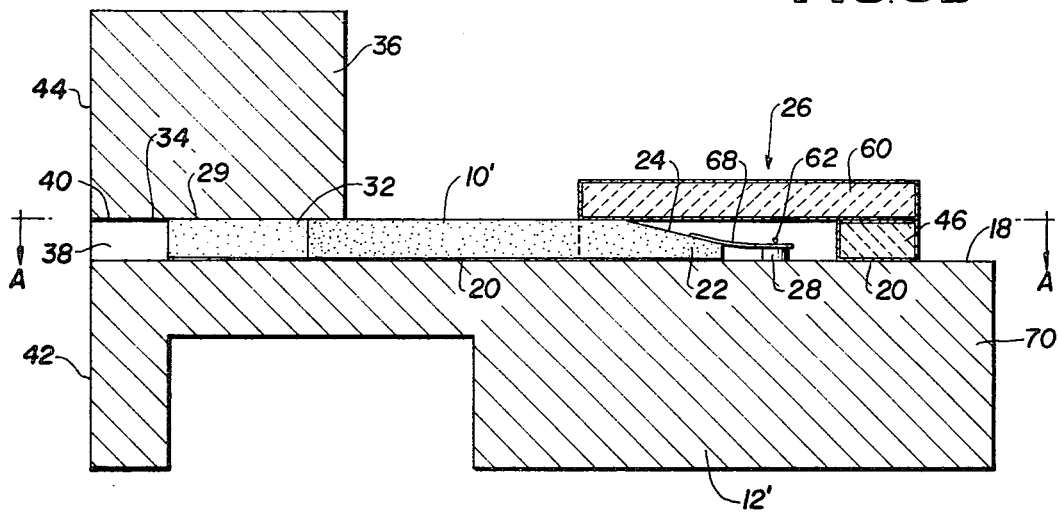

Referring now to a first embodiment of the subject invention, reference is now made collectively to FIGS. 3A and 3B, wherein FIG. 3A is a top elevational view taken along the section A—A of FIG. 3B and wherein FIG. 3B is a side elevational view taken along the section B—B of FIG. 3A. The embodiment shown therein comprises an IMPATT diode oscillator configuration wherein reference numeral 12' designates a gold plated aluminum substrate having a flat generally rectangular upper surface 18 on which an image guide element 10' is located. The image waveguide element 10' comprises a length of boron nitride (BN) wherein typically a=0.110 inches and b=0.074 inches while having a dielectric constant equal to 4.1. The length of the image guide 10' is formed from a BN wafer having a lower surface 20 which includes a layer of metallization consisting of, for example, successively applied films of 500 Å Cr, 3,000 Å Pt and 10,000 Å Au, which layer is soldered by means of a Pb-Sn composition to the surface 18 of the gold plated substrate 12'. The guide structure can be easily formed using sandblasting, machining, and laser cutting techniques and even casting. One end 22 of the image guide has its upper surface 24 tapered toward the ground plane and terminates in a metallized BN cavity 26 having mounted therein an IMPATT diode 28. The cavity structure preferably is formed from the same BN wafer from which the image guide is formed. The opposite end of the image guide 10' has the end portion 29 of side surfaces 30 and 32 placed in a metal waveguide section 34 to form an image guide to metal waveguide transition. The waveguide section 34 is preferably comprised of a gold plated aluminum type block type of member 36 which includes an elongated channel 38 of rectangular cross section formed on its lower surface 40 and which is secured to the upper surface 18 of the substrate 12' by means of, for example, mounting bolts not shown. The surface 18 and the channel 38 form a full height hollow metal V band waveguide section into which the tapered sides 30 and 32 project. Both the substrate 12' and the block member 36 include front surface portions 42 and 44 of substantially like dimensions in order to provide a waveguide flange section for coupling to an external transmission line element, not shown.

The oscillator cavity structure 26 as noted above preferably comprises an extension of the BN image guide 10' and is shown comprising a generally U-shaped member of boron nitride 46, whose outer surfaces are metallized and whose lower surface 20 is soldered to the surface 18 of the substrate 12' in the same manner as the image guide 10'. The metallized boron nitride cavity member 46 being formed from common BN wafer has a height substantially equal to the height of the image guide 10' and provides an air filled cavity region 48 bounded by two parallel distal portions 50 and 52 adjacent the image waveguide and a base portion 54. A separation between the distal members 50 and 52, greater than the width of the image guide 10', is formed in the BN wafer material to provide two thin elongated slots 56 and 58 that extend into the cavity which act to decouple the image guide 10' from the cavity 26 for proper modal propagation out of the cavity into the image guide element towards the transition section 34. In order to substantially enclose the cavity, a cover 60, in this instance also comprised of metallized boron nitride is placed on top of the top surfaces of portions 50, 52 and 54 and suitably bonded thereto.

The IMPATT semiconductor diode 28 located within the cavity region 48 is soldered to the ground plane surface 18 and is adapted to be energized by an electrical conductor 62. The conductor 62 is coupled to the diode 28 from a connector 64 mounted on the side of the substrate 12' through a small slot 66 formed in the distal cavity portion 50. Either silver epoxy or some type of lossy epoxy material is used to fill the small slot 66 in order to form a millimeter wave choke that prevents millimeter wave oscillations generated by the IMPATT diode 28 in the cavity region 48 from leaking out of the cavity region 48. Furthermore, a relatively thin ribbon element 68 consisting of, for example, gold and being typically 0.001 inches in thickness and 0.030 inches in width is soldered between the top of the IMPATT diode 28 and the tapered upper surface 24 of the image wave 10'. The purpose of the ribbon element 68 is to form an effective impedance transformer between the IMPATT diode 28 and the image guide 10' so that the generated oscillations occurring when a bias potential is applied to the connector 64 are sufficiently launched to and supported by the image wave. The portion 70 of the substrate 12' in the region of the IMPATT diode 28 and the cavity structure 26 is enlarged in order to provide a suitable heat sink for the oscillator.

Figure 4A:
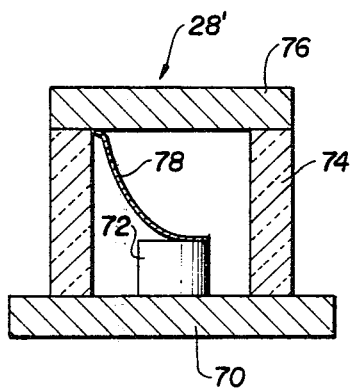
FIGS. 4A and 4A are illustrative of first and second IMPATT diode package configurations utilized in the embodiment shown in FIGS. 3A and 3B.
Figure 4B:
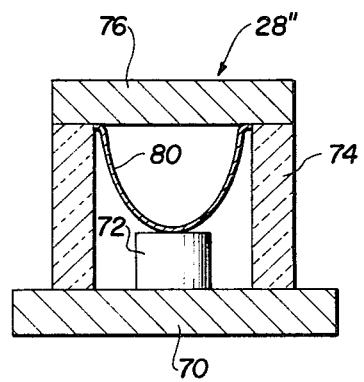

Referring now briefly to FIGS. 4A and 4B, there is shown two different IMPATT diode package configurations which are adapted to be located in the cavity 26. The two package configurations 28' and 28" both include a copper heat sink base member 70 upon which is mounted an IMPATT diode 72. A quartz ring 74 surrounds the diode 72 and is bonded to the base member 70. A copper disc 76 is placed on the quartz ring 74 for providing an external electrical contact for the diode. Contact to the diode 72 is provided by a single or a half strap element 78 in the configuration shown in 4A, whereas a full or double strap element 80 is utilized in the configuration shown in FIG. 4B. In both instances the strap elements 78 and 80 are formed of gold. It should be noted that package parasitics present a significant part of the load impedance to the device. For example, the half strap quartz ring package shown in FIG. 4A often times provides an oscillation frequency of 5 to 10 GHz below a package consisting of a full strap arrangement as shown in FIG. 4B.

Referring now to the second embodiment of the subject invention, it is directed to a Gunn oscillator configuration which in most respects is like the IMPATT oscillator configuration shown in FIGS. 3A and 3B. The major difference is in the form of the image guide element utilized and the Gunn diode package which obviates the need for the gold ribbon impedance transformer element 68. Directing attention to FIGS. 5A and 5B, a modified boron nitride image guide element, designated by reference numeral 10", is formed on the image plane and differs from the earlier version in that the image guide end portion 82 extending into the cavity structure 26 does not include a taper, but rather is terminated in a flat end face 84 having a height dimension equal to the full height of the image guide 10" which is typically 0.074 inches. A Gunn diode package 86 is located within the cavity region 48 and is soldered to the image plane surface 18. Also a metal plate 87 is substituted for the metallized BN cover member 60 shown in FIG. 3B.

Figure 6:
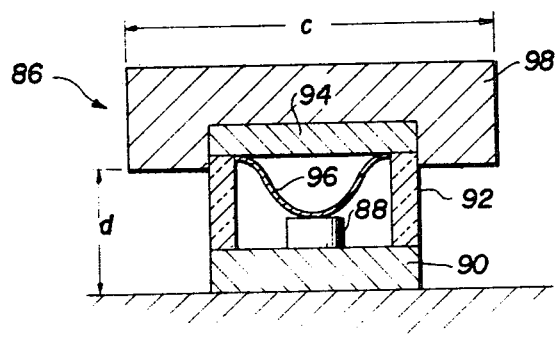
FIG. 6 is a cross sectional view illustrative of a Gunn diode package utilized in the embodiment shown in FIGS. 5A and 5B.

The details of the Gunn diode package 86 are shown in FIG. 6 and includes a Gunn diode 88 mounted on a heat sink base member 90. A quartz ring 92 surrounds the Gunn diode 88. An enlarged circular disc type metal cap 94 is secured on top of the quartz ring 92 and a full wave gold strap 96 connects the diode 88 to the metal cap 94. Impedance transformation between the Gunn diode device 88 and the image waveguide element 10" is provided by the thin metal disc cap 98. The disc diameter(c) and the gap dimension(d) between the disc 98 and the surface 18 of the gold plated aluminum substrate 12' determines the oscillation frequency. Typical disc diameters vary between 0.080 inches and 0.200 inches while the gap height typically varies between 0.005 inches and 0.010 inches.

Figure 5A:
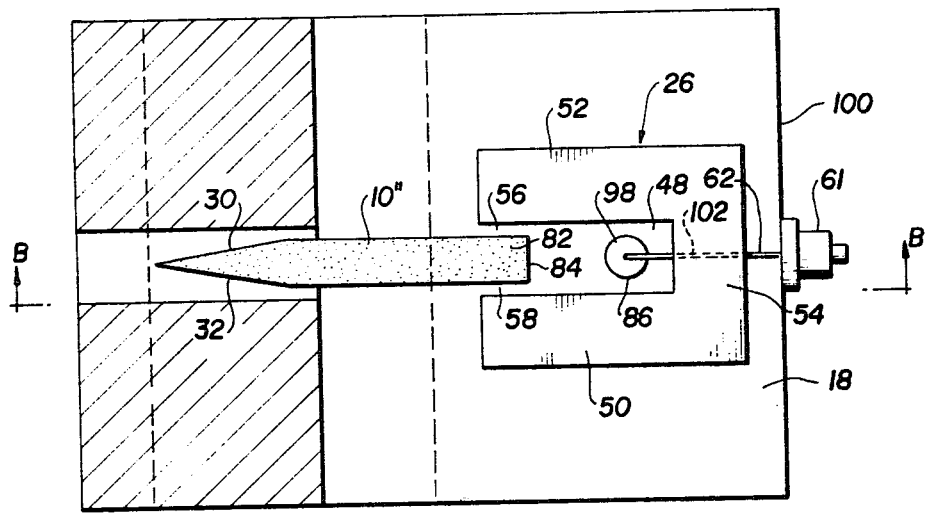
FIGS. 5A and 5B are sectional plan and side elevational views, respectively, of a second embodiment of the subject invention utilizing a Gunn diode.
Figure 5B:
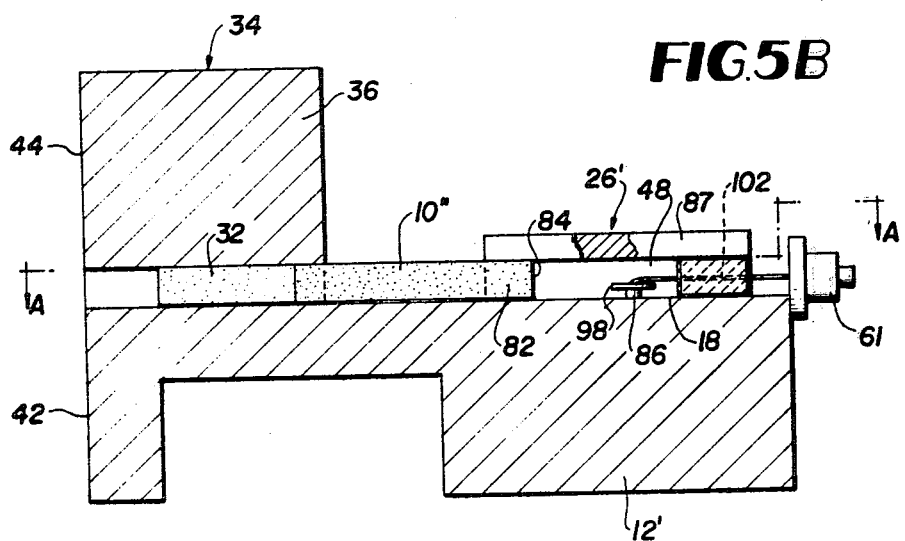

In the Gunn oscillator configuration shown in FIGS. 5A and 5B, while an energization source, not shown, can be coupled thereto as shown in the IMPATT oscillator embodiment, the instant configuration places the connector 61 on the back wall 100 of the substrate 12' and the wire conductor 62 is coupled to the diode package 86 through a slot 102 formed in the base portion 54 of the cavity structure 26.

It should be pointed out that with respect to both embodiments of the invention disclosed, the metallized U-shaped cavity member 46 in both instances has been noted to be preferably formed from the same piece of BN material as the image guide. It should be pointed out, however, that when desirable, the cavity structure can be constructed as a separate entity from the image guide. In such instances, a separate metallized piece of dielectric material of predetermined dimensions is soldered to the image plane 18 of the substrate 12'.

Thus what has been shown and described is an integrated oscillator which is adapted to be fabricated from a dielectric (BN) member which is soldered onto a metal image plane.

While there has been shown and described what is at present considered to be the preferred embodiments of the present invention, modifications thereto will readily occur to those skilled in the art. It is not desired, therefore, that the invention be limited to the specific arrangements shown and described, but it is intended to cover all such modifications and alterations which fall into the spirit and scope of the invention as defined in the appended claims.

What is claimed is:

1. A millimeter wave image guide integrated oscillator, comprising in combination:
   a metal substrate having a conductive surface defining an image plane;
   an image guide member in the form of a length of dielectric material having a relatively low propagation loss to signals applied thereto in the millimeter frequency range, said image guide member including a layer of metallization on one surface thereof which is bonded to said conductive surface;
   an air filled cavity structure formed from a body of dielectric material having a predetermined number of metallized outer surfaces, bonded to said conductive surface defining a cavity region thereby and including an opening through which one end of said image guide member projects into the cavity region a predetermined distance and additionally including decoupling means in the form of an elongated separation slot on either side of said image guide for decoupling the image guide from the cavity region for proper modal propagation of millimeter waves in the image waveguide;
   a millimeter wave solid state oscillator package bonded to said conductive surface and located in said cavity region and including means coupled through the metallized dielectric material of said cavity structure for receiving externally applied electrical power for energizing said oscillator package; and
   an image guide to metal waveguide transition consisting of a portion of said metal substrate and a metal body attached thereto, said body having a channel of rectangular cross section formed in one surface thereof, said channel being adjacent said conductive surface to form a hollow metal waveguide section and into which the opposite end of said image guide member projects a predetermined distance.

2. The oscillator as defined by claim 1 wherein the dielectric material of said image guide member is comprised of boron nitride.

3. The oscillator as defined by claim 1 wherein said body of dielectric material of said cavity structure is comprised of boron nitride.

4. The oscillator as defined by claim 1 wherein both said image guide member and said cavity structure are fabricated from a common wafer of boron nitride.

5. The oscillator as defined by claim 1 wherein said length of dielectric material and said body of dielectric material are comprised of boron nitride and have substantially the same height dimension relative to said conductive surface.

6. The oscillator as defined by claim 5 wherein said one end of the image guide which projects into said cavity region includes a downwardly tapered portion toward said conductive surface and wherein said opposite end of said image guide projecting into said metal waveguide includes tapered side walls.

7. The oscillator as defined by claim 6 wherein said oscillator package comprises an IMPATT diode package and additionally including impedance transformer means coupled between said diode package and the downwardly tapered portion of said image guide projecting into said cavity region.

8. The oscillator as defined by claim 7 wherein said impedance transformer means comprises a relatively thin ribbon of metallic material extending between said diode package and said downwardly tapered portion.

9. The oscillator as defined by claim 5 wherein said one end of said image guide projecting into said cavity region terminates in a substantially flat end surface having a height dimension substantially equal to the height dimension of the remaining portion of said image guide, and wherein said oscillator package comprises a Gunn diode package including means for coupling said diode package to said image waveguide.

10. The oscillator as defined by claim 9 wherein said means for coupling comprises a metallic disc attached to the top of said Gunn diode package.

11. The oscillator as defined by claim 1 wherein said hollow waveguide section defines a V-band waveguide section.

12. The oscillator as defined by claim 1 wherein said substrate is comprised of gold plated aluminum and wherein said layer of metallization bonded to said conductive surface consists of successively applied films of chromium, platinum and gold of predetermined thicknesses.

* * * * *